(12) United States Patent
Bickford et al.

(10) Patent No.: US 7,231,094 B2
(45) Date of Patent: Jun. 12, 2007

(54) LOW-POWER SIGNAL PROCESSING USING MEMS

(75) Inventors: James A. Bickford, Winchester, MA (US); Paul Ward, Roslindale, MA (US)

(73) Assignee: The Charles Stark Draper Laboratory, Inc., Cambridge, MA (US)

( * ) Notice: Subject to any disclaimer, the term of this patent is extended or adjusted under 35 U.S.C. 154(b) by 802 days.

(21) Appl. No.: 10/262,635

(22) Filed: Oct. 1, 2002

(65) Prior Publication Data

US 2004/0066977 A1    Apr. 8, 2004

(51) Int. Cl.
    *G06K 9/36* (2006.01)
(52) U.S. Cl. .................................... 382/248; 382/280
(58) Field of Classification Search ............... None
    See application file for complete search history.

(56) References Cited

U.S. PATENT DOCUMENTS

| 268,334 | A | 5/1882 | Abramson ............. 444/1 |
| 2,679,013 | A | 5/1954 | Barnes ............... 307/106 |
| 3,162,808 | A | 12/1964 | Haase ................ 324/77 |
| 3,182,256 | A | 5/1965 | Andrew ............... 324/77 |
| 3,209,250 | A | 9/1965 | Burns et al. ........... 324/77 |
| 3,786,180 | A | 1/1974 | Macovski ............. 178/6.5 |
| 4,040,091 | A | 8/1977 | Kornreich et al. ........ 358/213 |
| 4,099,207 | A | 7/1978 | Kornreich et al. ........ 358/213 |
| 4,471,445 | A | 9/1984 | Pernick ............... 364/485 |

(Continued)

FOREIGN PATENT DOCUMENTS

EP    0 881 477 A2    12/1998

(Continued)

OTHER PUBLICATIONS

International Search Report for PCT/US 03/31192, May 5, 2004, 10 pages.

(Continued)

*Primary Examiner*—Wenpeng Chen
(74) *Attorney, Agent, or Firm*—Goodwin Procter LLP

(57) ABSTRACT

Apparatus and methods for performing a Fourier transform mechanically, using an array of one or more resonators. By tuning the resonators so that their natural frequencies correspond to harmonics of an input signal, the vibration of the resonators in response to the input signal may be measured to provide phase and amplitude information that is equivalent to the Fourier coefficients of the input signal. Preferably, the resonators are microelectromechanical (MEMS) resonators. Using MEMS resonators, the Fourier transform of a signal can be determined using substantially less power than would be consumed by a digital signal processor (DSP) or microprocessor performing similar calculations. MEMS resonator-based apparatus and methods according to various embodiments may be used for applications including compression and image processing.

23 Claims, 8 Drawing Sheets

U.S. PATENT DOCUMENTS

| | | | |
|---|---|---|---|
| 4,754,491 A | 6/1988 | Mischler et al. | 382/41 |
| 4,780,831 A | 10/1988 | Iwata et al. | 364/484 |
| 5,589,082 A | 12/1996 | Lin et al. | 216/2 |
| 6,141,455 A * | 10/2000 | Matsuzawa et al. | 382/250 |
| 6,219,145 B1 | 4/2001 | Gutierrez et al. | 356/498 |
| 6,275,122 B1 | 8/2001 | Speidell et al. | 333/186 |
| 6,317,506 B1 | 11/2001 | Helbig et al. | 382/107 |
| 6,370,365 B1 | 4/2002 | Callaway, Jr. et al. | 455/130 |
| 6,374,677 B1 | 4/2002 | Berlin et al. | 73/662 |
| 6,412,131 B1 | 7/2002 | Zhao et al. | 7/659 |
| 6,713,938 B2 * | 3/2004 | Nguyen | 310/309 |
| 6,909,808 B2 * | 6/2005 | Stanek | 382/232 |
| 2001/0030489 A1 | 10/2001 | Nguyen | 310/309 |
| 2001/0033119 A1 | 10/2001 | Nguyen | 310/309 |
| 2005/0018295 A1 * | 1/2005 | Mendlovic et al. | 359/558 |
| 2005/0149598 A1 * | 7/2005 | Mendlovic et al. | 708/816 |

FOREIGN PATENT DOCUMENTS

EP    1 067 514 A1    1/2001

OTHER PUBLICATIONS

"Optical Microphone", IBM Technical Disclosure Bulletin vol. 33, No. 1A, Jun. 1, 1990. pp. 371-377, IBM Corp. New York, US.

"Discrete Fourier Transform Using Capacitive Cantileavers", IBM Technical Disclosure Bulletin vol. 40, No. 10, Oct. 1, 1997, pp. 53-55, IBM Corp. New York, US.

* cited by examiner

LOW-POWER SIGNAL PROCESSING USING MEMS

TECHNICAL FIELD

The invention relates to the field of signal processing. In particular, the invention relates to signal processing using low-power microelectromechanical systems (MEMS).

BACKGROUND

Many signal processing and compression algorithms in wide use perform a Fourier transform to translate an input signal into the frequency domain. For example, Fourier-based image and video compression schemes are among the most common and successful available in the industry today. Formats such as JPEG and MPEG (which are based on a discrete cosine transform that is similar to a Fourier transform) are especially prevalent and can be found in most commercial devices requiring video or image compression. Compression based on Fourier transforms facilitates use of robust algorithms and provides tunable performance with very good compression ratios that ultimately reduce memory storage and transmission requirements while maintaining high-quality signal reconstruction.

Fourier-based compression is a 'lossy' technique that achieves compression by selectively removing components from the image (or other signal) and only storing the most critical information. Typically, a Fourier transform is performed on a waveform representing a portion of an image or other signal, to derive a set of Fourier coefficients from which the waveform can be reconstructed. Compression is achieved by removing "unimportant" coefficients that do not play a significant role during reconstruction. The image quality and compression ratio can be traded off by varying the number of coefficients stored and used in this process, and the precision at which each coefficient is stored.

In addition to their use in compression, Fourier transforms are employed in many other signal-processing applications, including pattern recognition, spectrum analysis, filtering, image processing, and others. The ability to efficiently perform a Fourier transform is an operation that is important in numerous devices, including sensors, voice recognition devices, digital music players and recorders, digital cameras and video systems, and many other multi-media devices.

Traditionally, a computer processor or digital signal processor (DSP) chip, performs a "Fast Fourier Transform" (FFT) to convert spatially based or time-based information into wavespace (i.e., the frequency domain). For many applications, the FFT must be performed repeatedly and may become computationally costly. For example, for full color 640×480 video at 30 frames per second, 432,000 64-pixel image sub-blocks must be processed per second. Performing a 64-point FFT on each of these sub-blocks using the advanced Radix-2 algorithm requires 384 complex adds and 192 complex multiplies per sub-block, resulting in significant processing requirements.

While this is within the realm of processor technology, a chip capable of performing these functions draws a significant amount of power. Additionally, because these calculations are typically performed on a digital processor, it is often necessary to convert an analog signal into digital form prior to applying the calculations. The analog-to-digital conversion process may also draw a significant amount of power. While the power drain due to analog-to-digital conversion and calculation of a Fourier transform is relatively insignificant from the perspective of a desktop computer, embedded applications often require extremely small size and very lower power. The power demands of a high-performance processor or DSP that performs Fourier transforms may make their use impractical in many battery-operated embedded devices.

SUMMARY OF THE INVENTION

The invention addresses these difficulties by performing a Fourier transform mechanically, using an array of MEMS resonators in some embodiments. By tuning the resonators so that their natural frequencies correspond to harmonics of an input signal, the vibrations of the resonators in response to the input signal may be measured to provide phase and amplitude information that is equivalent to the Fourier coefficients of the input signal. Using MEMS resonators, the Fourier transform of a signal can be determined using substantially less power than would be consumed by a DSP or microprocessor performing similar calculations. Additionally, because the MEMS resonators effectively determine the Fourier transform in the analog domain, there is no need to convert analog signals into a digital form prior to processing, providing further power savings. MEMS resonator-based apparatus and methods according to various embodiments of the invention may be used for applications including compression and image processing.

In one aspect, the invention provides a method of compressing an input signal by mechanically processing the signal to derive its Fourier coefficients, where each of the Fourier coefficients corresponds to a wavenumber which has an amplitude that depends on the input signal. Non-critical information in the coefficients is then discarded. In some embodiments, coefficients corresponding to wavenumbers having an amplitude less than a predetermined threshold are discarded. The coefficients can also be quantized, and stored with less precision to achieve compression.

In some embodiments, a Fourier coefficient corresponds to a wavenumber of a harmonic of the input signal.

Some embodiments use an array of MEMS resonators, each having a natural frequency corresponding to one of the Fourier coefficients, to mechanically process the input signal.

In some embodiments, mechanically processing the input signal involves determining an amplitude and a phase of a response to the input signal.

In some embodiments, information in the coefficients that was not discarded is used to determine an output signal. In certain such embodiments, the output signal is converted into a digital output signal. In some such embodiments, the digital output signal is provided to a device that further processes the digital output signal.

In some embodiments, the digital output signal has a number of bits that depends on the wavenumber. In certain embodiments, the digital output signal has a number of bits that depends on a user-defined quality setting.

In another aspect, the invention provides apparatus for compressing an input signal, which includes a device for receiving the input signal and mechanically deriving Fourier coefficients therefrom. Each of the Fourier coefficients derived by the device corresponds to a wavenumber which has an amplitude and phase that depends on the input signal. The apparatus also includes a compression device that discards non-critical information in the Fourier coefficients. In some embodiments, Fourier coefficients corresponding to wavenumbers having an amplitude less than a predetermined threshold are discarded.

In some embodiments, each of the wavenumbers corresponds to a harmonic of the input signal.

In some embodiments, the device that receives the input signal and mechanically derives Fourier coefficients includes a MEMS resonator. In some such embodiments, the MEMS resonator has a natural frequency that corresponds to a harmonic of the input signal.

In some embodiments, the device that receives input signals and derives Fourier coefficients includes a device that determines an amplitude and a phase of a response to the input signal.

In some embodiments, the input signal is an analog input signal. In certain such embodiments, the compression device generates an analog output signal. This analog output signal may be converted into a digital output signal using an analog-to-digital converter. In some embodiments, the digital output signal may have a number of bits that depends on the wavenumber. In certain embodiments, the digital output signal has a number of bits that depends on a user-defined quality setting.

In another aspect, the invention provides a method of computing coefficients of a Fourier series for an input signal. This is done by applying the input signal to an array of MEMS resonators, in which each of the MEMS resonators has a natural frequency corresponding to one of the coefficients. The method involves measuring an amplitude of a response to the input signal of each of the MEMS resonators, and recovering a phase of each of the MEMS resonators relative to the input signal. In some embodiments, the MEMS resonators are harmonically tuned.

In some embodiments, recovering the phase involves taking first and second instantaneous position measurements, and computing the phase as a function of the amplitude, the first instantaneous position measurement, and the second instantaneous position measurement.

In another aspect, the invention provides apparatus for computing coefficients of a Fourier series for an input signal. The apparatus includes numerous MEMS resonators, each of which responds at a frequency corresponding to a wavenumber in the Fourier series. The apparatus also includes a detector that measures the amplitude and phase responses of each of the MEMS resonators. In some embodiments, the natural frequencies of the MEMS resonators correspond to harmonic frequencies of the input signal.

In a further aspect, the invention provides a method of compressing an image. First, the image is deconstructed into one or more sub-blocks, each sub-block containing a predetermined number of pixels. Next, for each sub-block, the pixels are scanned to create a one-dimensional waveform, which serves as an input signal to an electromechanical device that derives coefficients of a Fourier series for the one-dimensional waveform, each of the coefficients indicating an amplitude. Non-critical information in the coefficients of the Fourier coefficients is discarded. In some embodiments, coefficients of the Fourier series for which the amplitude is below a predetermined threshold are discarded. In some embodiments providing the one-dimensional waveform as in input signal to an electromechanical device involves applying the one-dimensional waveform to an array of MEMS resonators.

In another aspect, the invention provides an image processing apparatus that includes an electromechanical device that has means for processing an input signal representing an image into an output signal representing a processed image. In some embodiments, the electromechanical computing device includes an array of MEMS resonators. In some embodiments, the input signal includes an analog input signal representing the image, and the output signal includes an analog output signal.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which.

DESCRIPTION

The present invention provides apparatus and methods for performing a variety of signal processing tasks, including compression and image processing using microelectromechanical systems (MEMS). Specifically, the invention provides a MEMS-based device and methods for determining Fourier coefficients for an input signal. Advantageously, the apparatus and methods of the invention are able to determine the Fourier coefficients in the analog domain, and have power requirements that are substantially lower than devices that perform similar functions digitally.

Figure 1A:
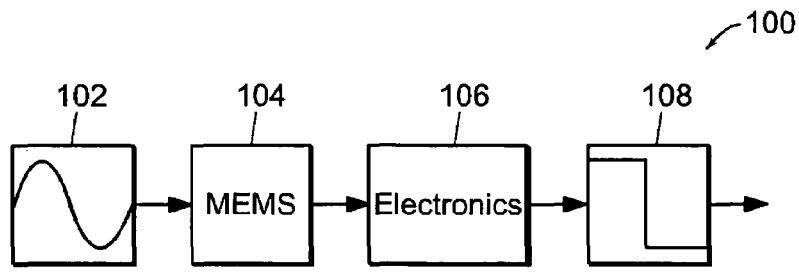
FIGS. 1A–1D are block diagrams showing high-level configurations of an example compression system in accordance with an embodiment of the invention.

Referring to FIG. 1A, an overview of a system 100 for compressing a signal in accordance with the invention is described. An analog signal 102 is provided to a MEMS device 104, the structure of which will be described in greater detail below. In one embodiment, the MEMS device 104 includes an array of MEMS resonators that are excited by the input signal. The natural frequencies of the resonators are made to closely align with the harmonic frequencies within the input signal, so that the resonators respond in a characteristic way to these harmonic frequencies. As will be shown more rigorously below, the response of the MEMS resonators is directly analogous to the Fourier coefficients that are used in lossy image and data compression, as well as in other signal-processing tasks.

An electronic device 106 measures the response of the MEMS device to the input signal, and determines a phase and amplitude of the response for each wavenumber. Determining the phase and amplitude of the response of the MEMS device is effectively an alternative to calculating the Fourier coefficients with a more traditional digital algorithm.

Once the Fourier coefficients are determined, data compression may be achieved by discarding non-critical information in the Fourier coefficients. For example, the amplitude and phase measurements of wavenumbers with small amplitudes are generally non-critical information, and may be discarded. This can be achieved by rendering the electronic device 106 insensitive to signals from the MEMS device for which the amplitude does not exceed a threshold. Alternatively, the amplitude at each wavenumber may be compared to a threshold, and those that do not meet the threshold may be ignored or discarded. The quality of the compressed signal can be traded off for compression ratio by changing this threshold or cutoff value. Other examples of non-critical information that may be discarded include extra precision in the measurements of the amplitude or phase, or other information that has little or no significant perceptible effect on reconstruction of the signal.

Figure 1B:
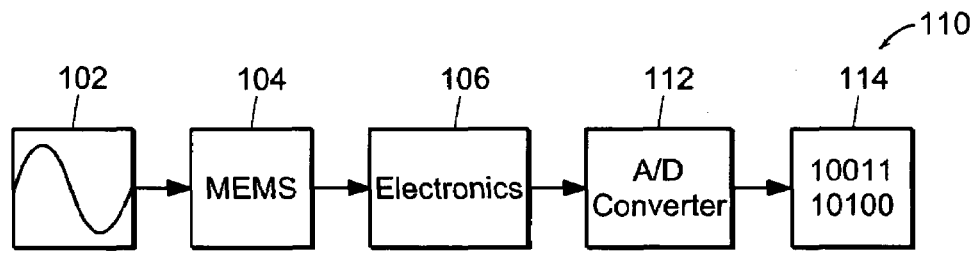
Figure 1C:
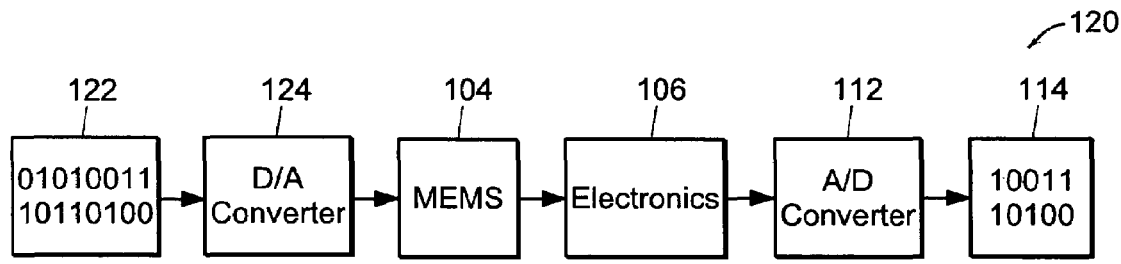
Figure 1D:
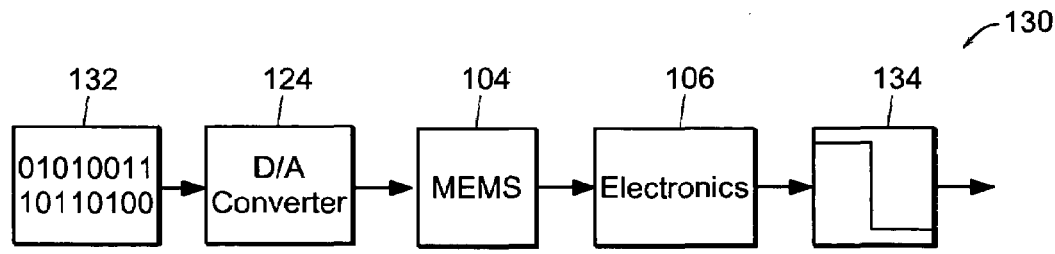
Figure 2:
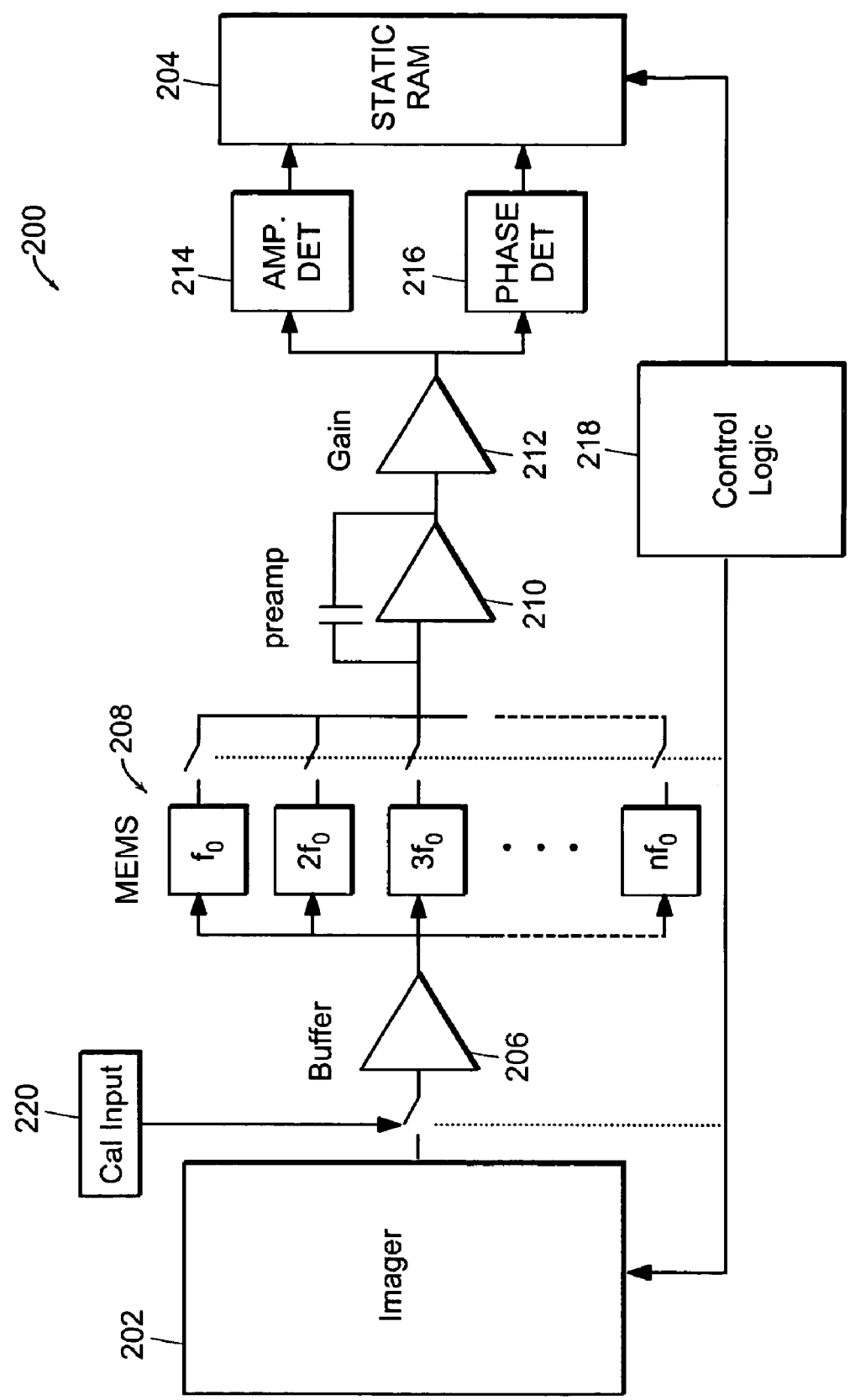
FIG. 2 is a block diagram showing an example electronics configuration of a compression system according to an embodiment of the invention.

The system 100 shown in FIG. 1A produces an analog output signal 108. By adding additional components, such an analog output signal can be converted to a digital output signal. FIG. 1B shows a system 110, similar to the system 100 of FIG. 1A, but configured to produce a digital output.

In the system 110, the output of the electronic device 106 is converted into a digital signal 114 by an analog-to-digital converter 112. Digital signal 114 may be used or stored by a variety of digital systems. For example, the system 110 may serve as a compression pre-processor that achieves a degree of compression of a signal. Once the signal has been compressed by the system 110, the digital signal 114 may be further compressed or processed using known digital compression algorithms.

Advantageously, compression occurs prior to conversion of the signal into digital form by the analog-to-digital converter 112. This permits use of a lower speed and lower power analog-to-digital converter than would be needed if the conversion were performed prior to compression. Typically, the power consumption of the analog-to-digital converter 112 may be substantially reduced relative to the power-consumption of an analog-to-digital converter capable of converting the input signal 102 to digital form.

Power savings may also be achieved by reducing the number of bits of the analog-to-digital conversion, depending on the particular wavenumber being processed. For signals such as images, higher wavenumbers may be converted using fewer bits, with the highest wavenumbers being completely discarded. The particular number of bits Signals generated by the MEMS resonators 208 are amplified by a preamplifier 210 and a gain amplifier 212. The signals are then sent to an amplitude detector 214 and a phase detector 216, which respectively determine the amplitude and phase of the response of the MEMS resonators 208.

To achieve compression, if the amplitude associated with one of the MEMS resonators 208 (i.e., the amplitude of one of the wavenumbers) is lower than a cutoff or threshold amplitude, then the signal from that resonator is discarded or ignored. Following discard of below-threshold signal components, the signal is converted to a digital form, and is stored in static RAM 204.

This process is controlled by a control logic module 218, which determines when signals are sent from the imager 202, which response signals from the MEMS resonators 208 are used, where results are stored in static RAM 204, and other system control tasks. In some embodiments, the control logic 218 may be a microcontroller, or other programmable device.

In addition to receiving input from the imager 202, the MEMS resonators 208 may receive input from a calibration input module 220. Calibration input 220 provides a known input signal against which the system 200 may be calibrated.

In will be understood that in some embodiments, various of the components of the system 200 may be changed. For example, various forms of digital storage may be substituted for the static RAM 204. Additionally, depending on the type of input signal desired, the imager 202 may be replaced with any of a variety of input signal sources.

Figure 3:
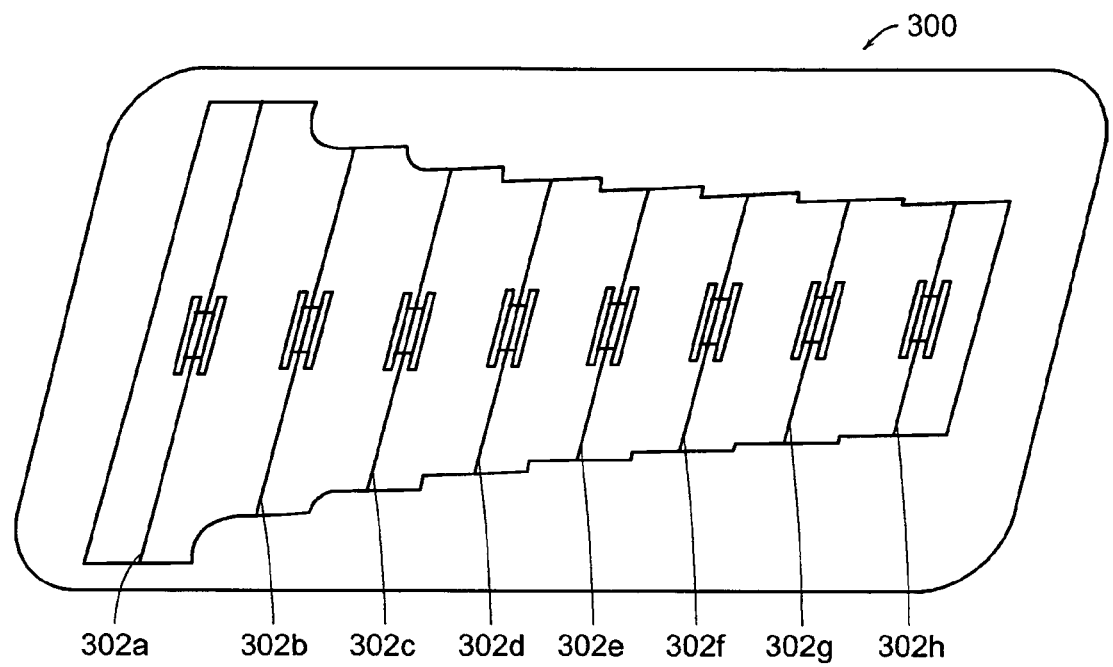
FIG. 3 shows an array of eight MEMS resonators, for use in a system in accordance with an embodiment of the invention.

Referring now to FIG. 3, an array of MEMS resonators in accordance with the present invention is shown. In the embodiment shown in FIG. 3, the array 300 includes eight MEMS resonators 302a–302h. As can be seen, each of the MEMS resonators 302a–302h includes a beam that vibrates in response to an input signal. The beams of resonators 302a–302h have different lengths and/or other design parameters, giving each resonator a different natural frequency. In particular, the natural frequencies of the MEMS resonators 302a–302h correspond to harmonics of the expected input signal, or to the wavenumbers of a Fourier series.

In an alternative embodiment (not shown), a single MEMS resonator may be used instead of an array, and the input signal may be rescanned at various rates to match the harmonics of the input signal to the resonator frequency. For example, by rescanning the input signal at different rates and reapplying the rescanned input signal to a single resonator four times, results equivalent to those produced by an array of four resonators may be produced.

Similarly, an input signal that has been rescanned at various rates may be reapplied to an array of MEMS resonators to effectively multiply the number of resonators. For example, by rescanning and reapplying an input signal at two different rates to an array of eight resonators, results that are equivalent to applying the signal to an array of sixteen resonators may be achieved, depending on the original frequencies, relative to the input scan rate. The results will generally depend on the resonators that are used during the original application of the signal to the MEMS resonators, and each reapplication.

It will be understood that the array of eight MEMS resonators shown in FIG. 3 is only an example. Generally, an array of MEMS resonators according to an embodiment of the invention may contain any number of MEMS resonators greater than or equal to one.

Figure 4:
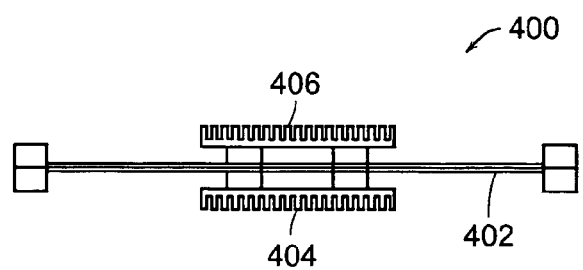
FIG. 4 is a diagram showing the structure of a MEMS resonator for use with a system according to an embodiment of the invention.

FIG. 4 shows an individual MEMS resonator that 400 may be used with some embodiments of the invention. Resonator 400 includes a beam 402 and a pair of comb finger assemblies 404 and 406. As described above, beam 402 has a natural frequency based on its length, or on other design parameters. In operation, the comb finger assemblies 404, 406 engage with a drive mechanism and a sensing mechanism (not shown). Generally, one of the comb finger assemblies 404 or 406 electromagnetically engages with the drive mechanism, driving the vibration of the beam according to an analog electrical input signal. The other one of comb finger assemblies 404 or 406 electromagnetically engages the sensing mechanism, which senses the motion of resonator 400 and provides an analog electrical signal indicative thereof. It will be understood that other types of driving and sensing mechanisms may be used. For example, sensing mechanisms may include optical, electro-optical, or piezoelectric devices.

Figure 5A:
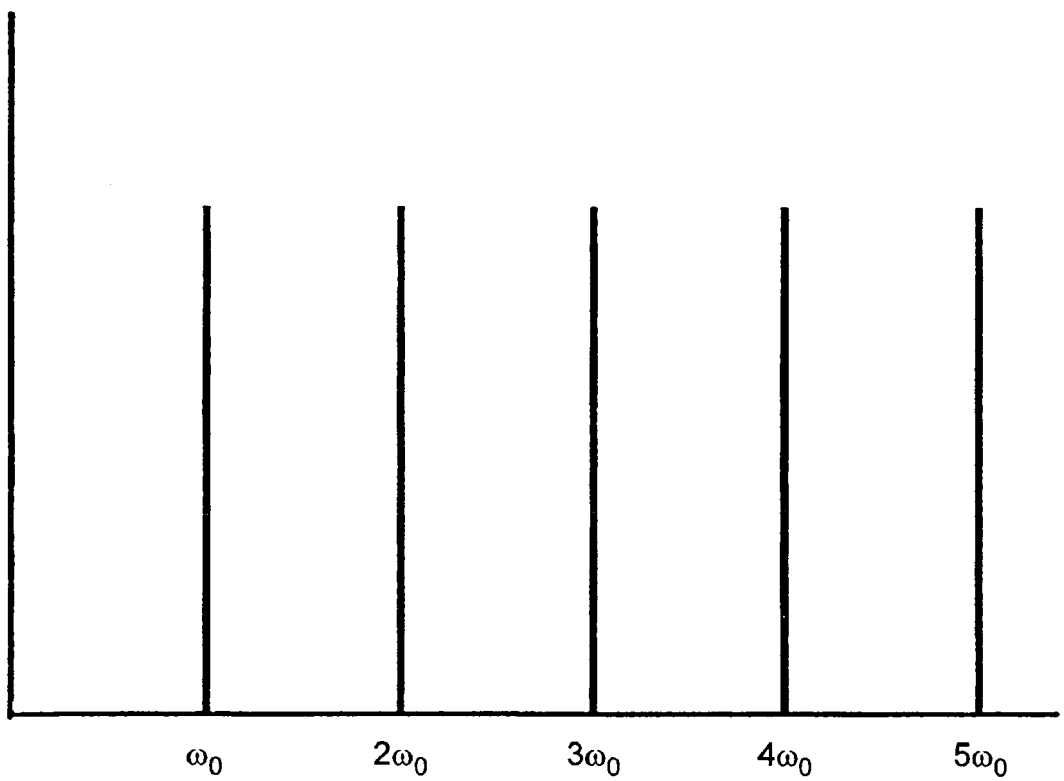
FIGS. 5A–5B are graphs showing the results of performing a Fourier transform digitally and mechanically, respectively.

The physical response of harmonically tuned MEMS resonators can be used to approximate the coefficients of a Fourier series at a particular wavenumber with a known gain and phase lag. FIG. 5A shows an example of the results of performing a digital Fourier transform. As can be seen, at each wavenumber, there is a value that indicates the amplitude for that wavenumber.

Figure 5B:
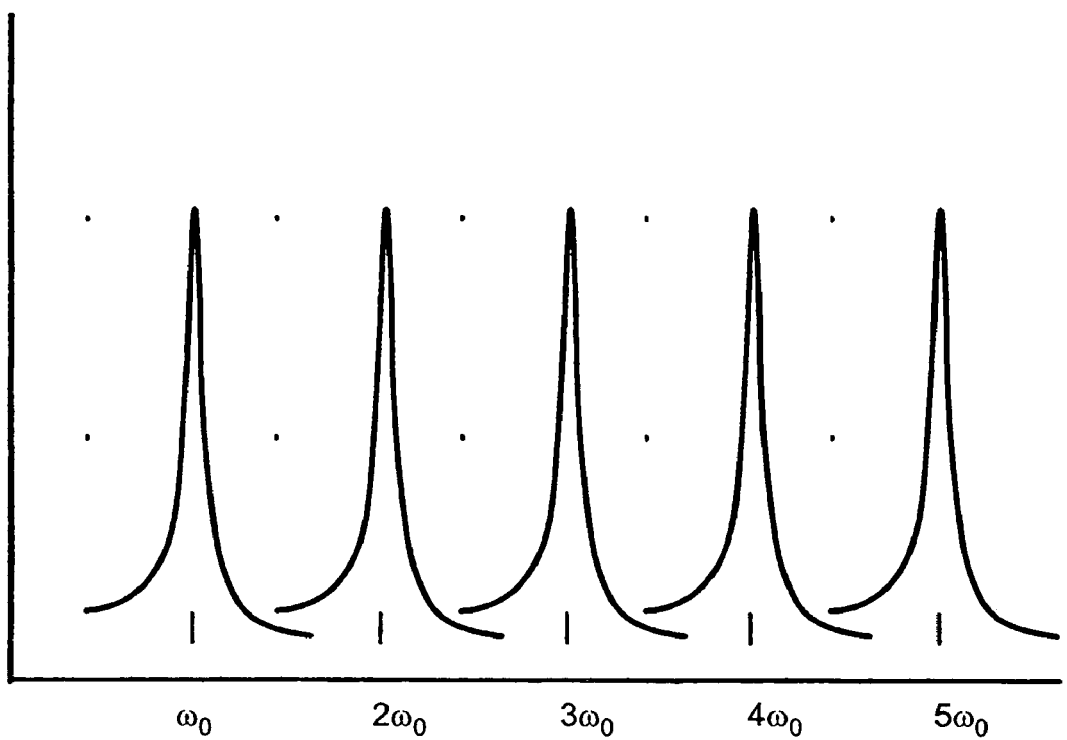

FIG. 5B shows the physical response of an array of MEMS resonators, as used in accordance with the invention to determine Fourier coefficients. As can be seen, at each wavenumber, there is a peak that indicates the amplitude. Due to the mechanical nature of the determination of the Fourier transform, a certain degree of error is introduced. As shown in FIG. 5B, the resonators generally respond only within a narrow band of frequencies, rather than producing results only at discrete frequencies, as is the case with a digital Fourier transform. As described below, it is possible to place bounds on these errors, and to compensate for them to a degree, based on calibration of the MEMS device.

Advantageously, the use of MEMS resonators to perform a Fourier transform in accordance with an embodiment of the invention consumes substantially less power than is typically required to perform the calculations necessary to compute a Fourier transform using a digital signal processor (DSP) or microprocessor. Additionally, an array of MEMS resonators and the associated electronics may be considerably smaller than microprocessors or DSPs that may perform similar functions. These size and power advantages may be particularly useful in handheld and miniaturized multi-media devices such as digital cameras, cell phones, personal digital assistants, wristwatches, or other small, battery-operated devices that benefit from advanced signal processing and compression.

Summary of the Fourier Series

Assuming that a signal, f(x), is infinitely differentiable about a point, a Taylor series representation of the function can be constructed about that point to represent the signal. Likewise, if the signal is continuous and periodic, a trigonometric series can be constructed to represent the signal. This special series, called the Fourier Series, is of the form given in equation (1).

$$f(x) = a_0 + \sum_{n=1}^{\infty} \left( a_n \cos\frac{n\pi x}{l} + b_n \sin\frac{n\pi x}{l} \right) \quad (1)$$

where the Fourier coefficients are given by the Euler formulas of equation (2).

$$a_0 = \frac{1}{2l} \int_{-l}^{l} f(x) dx \quad (2)$$

$$a_n = \frac{1}{l} \int_{-l}^{l} f(x) \cos\frac{k\pi x}{l} dx, \quad n = 1, 2, \ldots$$

$$b_n = \frac{1}{l} \int_{-l}^{l} f(x) \sin\frac{k\pi x}{l} dx, \quad n = 1, 2, \ldots$$

Provided that the coefficients are known or can calculated, the original signal can be reconstructed.

Though formally evaluating equation (1) requires summing an infinite number of terms, a small number of terms can generally represent the signal to the required accuracy.

Equation (1) can alternately be represented in an amplitude-phase form as:

$$f(x) = A_0 + \sum_{n=1}^{\infty} A_n \cos\left(\frac{n\pi x}{l} + \phi_n\right) \quad (3)$$

$$A_n = [a_n^2 + b_n^2]^{1/2}$$

$$\phi_n = \tan^{-1}\left(\frac{b_n}{a_n}\right)$$

If the periodic function is temporal instead of spatial, the fundamental frequency is:

$$f_0 = \frac{1}{T}, \text{ or } \omega_0 = \frac{2\pi}{T} \quad (4)$$

where T is the time period of the waveform.

If the function is further restricted to having a discrete number of points within a time domain of length T, equation (1) can be reduced to amplitude-phase form with a finite number of terms in the series:

$$f(t) = A_0 + \sum_{k=1}^{N/2} \left( A_k \cos\frac{k\omega_0 t}{T} + \phi_k \right) \quad (5)$$

For an input signal with N discrete values, N/2 sinusoids with varying amplitude and phase can be summed to exactly reconstruct the original input signal. These sinusoids include the fundamental wave and N/2−1 harmonics. For each wavenumber, the frequency is $$\omega_k = \frac{2\pi k}{T} \quad (6)$$

with the maximum frequency equal to $$\omega_{max} = \frac{\pi N}{T} \quad (7)$$

This corresponds to the Nyquist criterion for sampling.

In accordance with the invention, mechanical resonators (such as MEMS resonators) may be used to determine the coefficients of a Fourier series. Generally, underdamped mechanical resonators selectively respond to a narrow band of frequencies. In a discrete system, a limited range of wavenumbers are used to reconstruct the signal.

Although a mechanical resonator is not of a discrete nature, if its natural frequency is configured to match the fundamental frequency or a harmonic of the input signal, the resonator will respond as if it is being excited by that single frequency. Such a resonator will have a limited response to the other wavenumbers, due to the attenuation discussed below.

In accordance with the invention, such a mechanical resonator inherently responds with its phase and amplitude equivalent to the phase and amplitude of the Fourier series given in equation (5).

Damped Mechanical Resonators

With a signal created from N discrete points, the real and imaginary components of N/2 wavenumbers can be used to exactly reproduce the signal. Using fewer wavenumbers and reduced precision in the reconstruction process discards some information, but does not necessarily degrade the signal beyond acceptable limits. This fact is widely used to compress images and other signals.

According to an embodiment of the invention, MEMS image compression and other signal compression and signal processing applications may use an array of resonators to determine the Fourier coefficients. A harmonic resonator that is underdamped characteristically responds to a narrow band of frequencies. Measuring the amplitude and phase of a resonator excited by an input signal and tuned to match a harmonic of the input signal is equivalent to calculating the coefficients for a given wavenumber. Monitoring an array of these resonators yields information that may be used to reconstruct the original input signal. This can be done using significantly less power than would be needed to compute similar results using a DSP or microprocessor.

A MEMS resonator can be modeled as a spring having a single degree of freedom, and that responds linearly under loads producing small deflections. Acting under a force, F, and with spring stiffness, K, the deflection of the resonator is given by:

$$\Delta = \frac{F}{K} \qquad (8)$$

This deflection, or amplitude, is a response to a static force input. To act as a Fourier transform processor, the resonator should dynamically respond to a signal that varies with time. In this situation, inertia and damping play a substantial role in the response of the device. A differential equation governing the response of such a resonator with an effective mass m and damping b is given as:

$$m\ddot{x}(t)+b\dot{x}(t)+Kx(t)=F(t) \qquad (9)$$

This can further be modified to, $$\ddot{x}(t)+2\zeta\omega_n\dot{x}(t)+\omega_n^2 x(t)=F(t) \qquad (10)$$

where the non-dimensional damping factor $\zeta$ is equivalent to:

$$\zeta = \frac{b}{2m\omega_n} \qquad (11)$$

for a given natural frequency, $\omega_n$.

For small damping ratios, the resonator's quality factor is given approximately as:

$$Q = \frac{1}{2\zeta} \qquad (12)$$

When excited by a harmonic input signal $f(t)=F\cos(\omega_n t+\phi)$, the device will have a phase lag of $\pi/2$ radians, and a maximum response of:

$$\Delta_{max} = \frac{FQ}{K} \qquad (13)$$

If the stiffness and Q of the resonator are known, the original forcing function can be determined by measuring the amplitude and phase response of the resonator.

In general, the forcing function does not take the form of a single frequency that matches the natural frequency of the resonator. Instead, as equation (1) suggests, any arbitrary input signal is a combination of intrinsic frequencies with phase offsets. The resonator will characteristically respond to each of these. The input force at each of these frequencies is effectively attenuated because the resonator acts as a bandpass filter. The transmissibility or magnification factor depends upon the quality factor and the relative frequency ratio, as is given by:

$$T_{\omega\to\omega_{nat}} = \sqrt{\frac{1+\frac{1}{Q^2}\frac{\omega^2}{\omega_{nat}^2}}{\left(1-\frac{\omega^2}{\omega_{nat}^2}\right)^2+\frac{1}{Q^2}\frac{\omega^2}{\omega_{nat}^2}}} \qquad (14)$$

In addition, the phase lag is not $\pi/2$ radians when excited by a frequency off resonance. Instead, the phase lag is given as:

$$\varphi = \tan^{-1}\left(\frac{\frac{1}{Q}\frac{\omega}{\omega_{nat}}}{1-\left(\frac{\omega}{\omega_{nat}}\right)^2}\right) \qquad (15)$$

Figure 6:
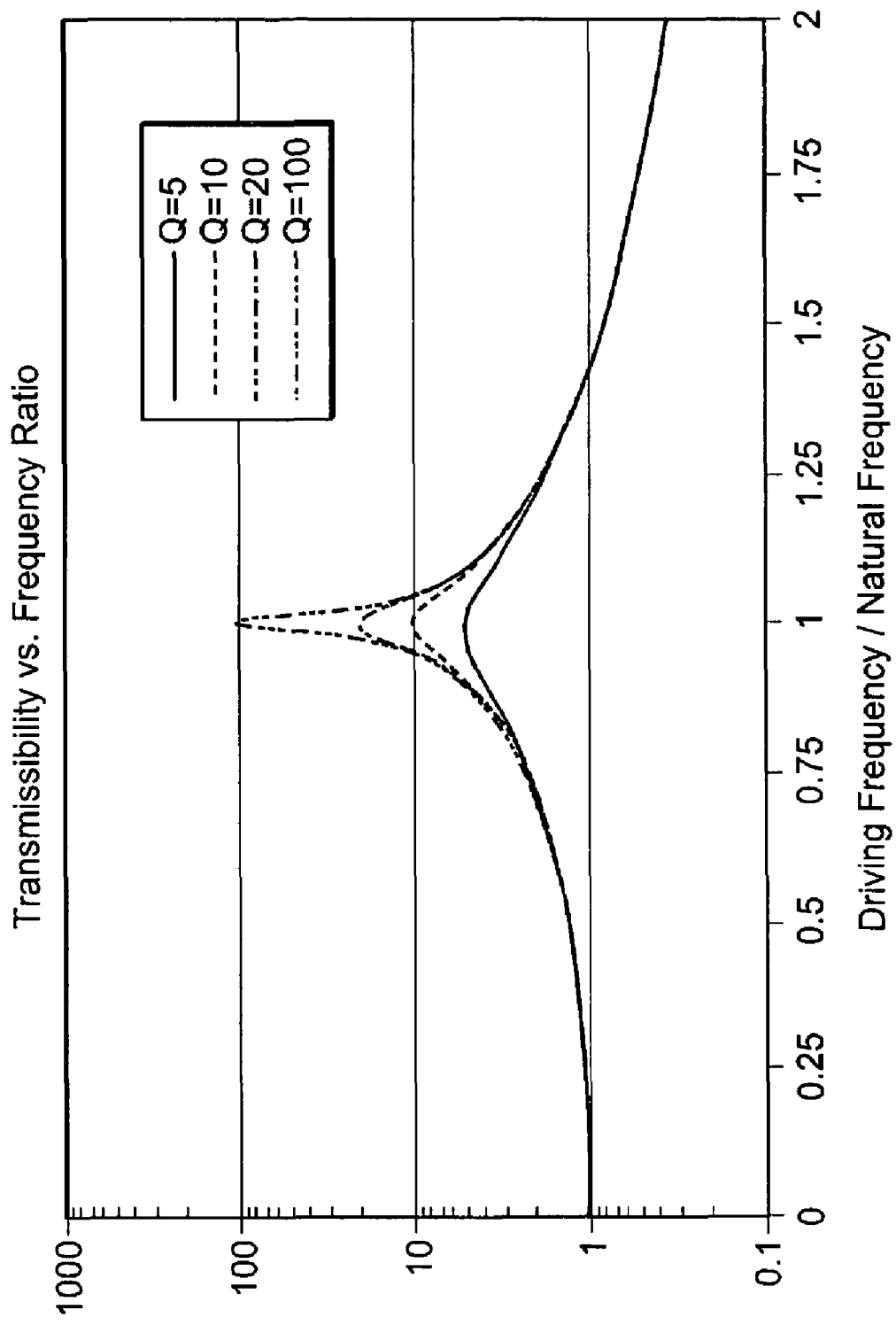
FIG. 6 is a graph showing the transmissibility in a response of a resonator to a sinusoidal input frequency as a function of the relative frequency ratio.
Figure 7:
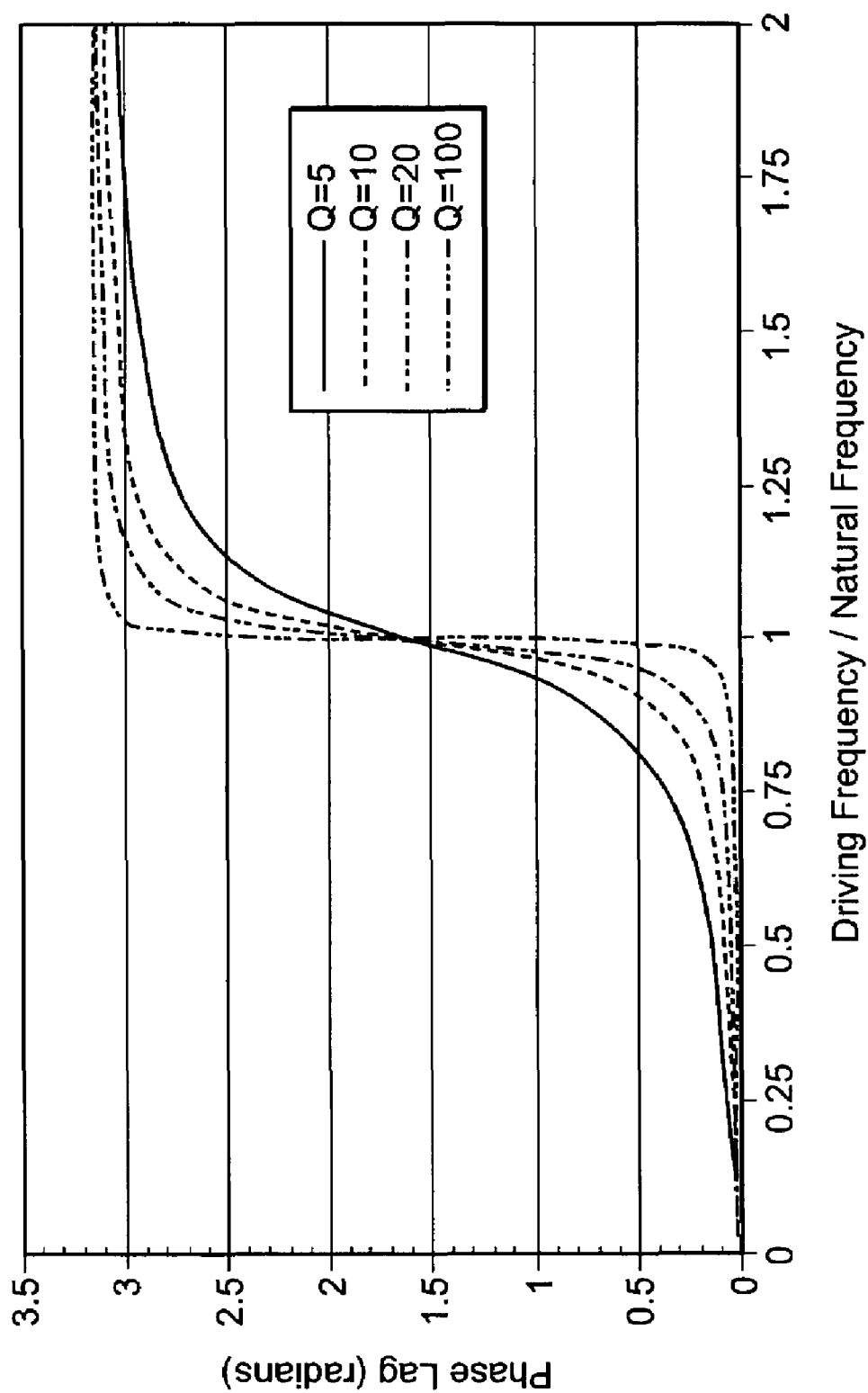
FIG. 7 is a graph showing the phase lag in a response of a resonator to a sinusoidal input frequency as a function of the relative frequency ratio.

FIG. 6 shows a plot of the transmissibility in a relative response of a resonator to a sinusoidal input frequency as a function of the relative frequency ratio. FIG. 7 shows a plot of the phase lag.

As discussed above, a mechanical resonator is excited by the harmonics within the input signal. This is achieved by applying the input signal as a forcing function, where the amplitude is converted to a force that is applied to the resonator. The input signal, which may be applied as a changing voltage between the resonator and the drive mechanism described above, directly corresponds to the force applied to the resonator, and changes in time similarly. The response of the resonator to the input signal is given by:

$$F(t)=\Psi(t)\cdot G \qquad (16)$$

where $\Psi$ is the original value of the input signal (e.g. a pixel value for image processing applications)

Depending upon its Q and transmissibility, the response due to a given harmonic within the input signal is:

$$\Delta_k(t) = \frac{\Psi_k \cdot G \cdot T_k}{K_k}\cos\left(\frac{k\omega_0 t}{T}+\phi_k\right) \qquad (17)$$

where:

$$T_k = \sqrt{\frac{1 + \frac{1}{Q^2}\frac{\omega_k^2}{\omega_{nat}^2}}{\left(1 - \frac{\omega_k^2}{\omega_{nat}^2}\right)^2 + \frac{1}{Q^2}\frac{\omega_k^2}{\omega_{nat}^2}}} \qquad (18)$$

Equation (18) gives the transmissibility between a given resonator of frequency $\omega_n$ and a harmonic at $\omega_k$. Equations (17) and (18) assume that the resonator has time to completely reach resonance. In reality, the device takes some amount of time to respond fully in this way. The actual displacement is given by:

$$\Delta_k(t) = \frac{\Psi_k \cdot G \cdot T_k}{K_k} \cos\left(\frac{k\omega_0 t}{T} + \phi_k\right) \cdot \left(1 - e^{\frac{-k\omega_0 t}{2Q_k}}\right) \qquad (19)$$

Over one cycle, the maximum amplitude is equal to:

$$\tilde{A}_k(t) = \frac{\Psi_k \cdot G \cdot T_k}{K_k} \cdot \left(1 - e^{\frac{-k\omega_0 t}{2Q_k}}\right) \qquad (20)$$

The measured phase is equal to:

$$\Phi_k = \phi_k - \tan^{-1}\left(\frac{\frac{1}{Q_k}\frac{\omega_k}{\omega_{nat}}}{1 - \left(\frac{\omega_k}{\omega_{nat}}\right)^2}\right) + \theta_k \qquad (21)$$

where $\theta$ is an arbitrary phase offset determined by the measurement offset relative to the input signal. This should remain constant and is calibrated for the device.

If the phase and amplitude of a resonator can be measured, the equivalent magnitude of the signal for a given wavenumber can be expressed by simply rearranging the previous two equations. Therefore, the signal amplitude for a given wavenumber is:

$$\Psi_k = \frac{A_k(t) \cdot K_k}{G \cdot T_k \cdot \left(1 - e^{\frac{-k\omega_0 t}{2Q_k}}\right)} \qquad (22)$$

The phase is:

$$\phi_k = \Phi_k + \tan^{-1}\left(\frac{\frac{1}{Q_k}\frac{\omega_k}{\omega_{nat}}}{1 - \left(\frac{\omega_k}{\omega_{nat}}\right)^2}\right) - \theta_k \qquad (23)$$

Generally, the amplitude of the response of a resonator is directly measured. However, in some embodiments, it may not be possible to directly measure the phase of the resonator response relative to the input signal. One method of computing the phase involves taking two instantaneous position measurements in conjunction with the maximum amplitude of vibration. If the amplitude is known, a position measurement at a given point relative to the forcing function narrows the possible phase to two possible values. A second measurement temporally nearby constrains the phase to a single value.

Figure 8:
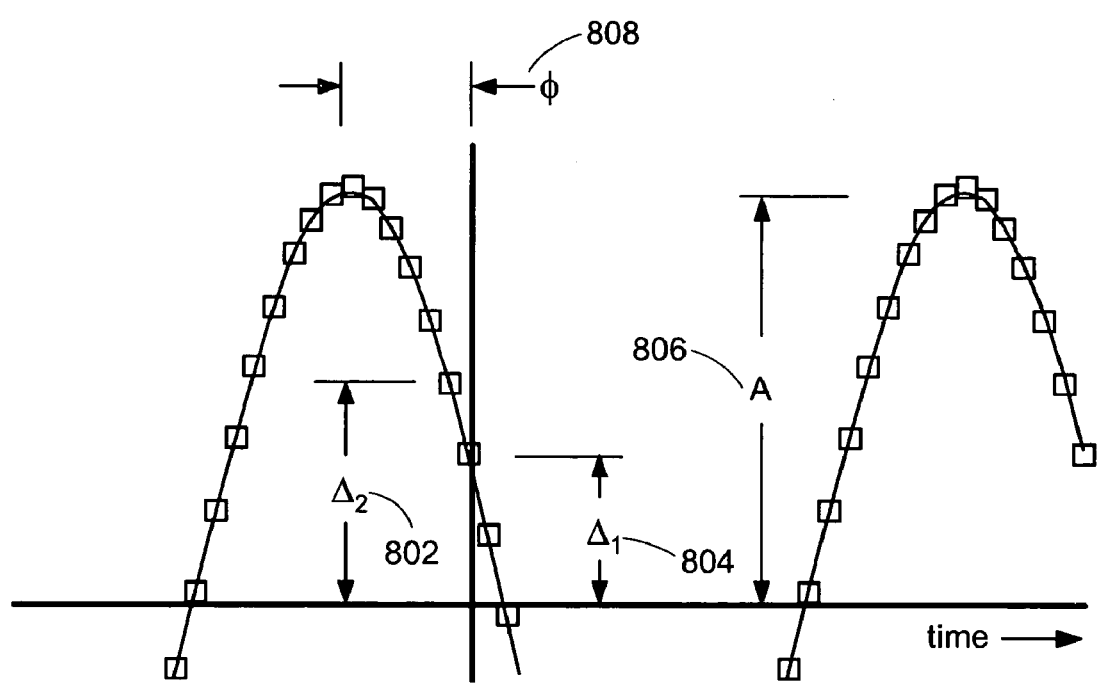
FIG. 8 is a graph illustrating recovery of phase information from instantaneous position measurements, in accordance with an embodiment of the invention.

This method of determining the phase is illustrated in FIG. 8. The system takes a first instantaneous position measurement 802, labeled $\Delta_2$. A short time later, the system takes a second instantaneous position measurement 804, labeled as $\Delta_1$. The amplitude 806 can be directly measured. Based on these three measurements, the system can compute the measured phase as:

$$\Phi_k = \frac{1\text{bit(polarity)}}{(\Delta_1 - \Delta_2)} \cdot \cos^{-1}\left(\frac{\Delta_1}{A_k}\right) \qquad (24)$$

The actual phase 808 is computed using equation (23). It will be understood that in some embodiments, other methods of determining the phase may be used.

Signal Reconstruction

In accordance with an embodiment of the invention, a bank of resonators excited by an input signal that is to be compressed vibrates at an amplitude and a phase angle proportional to the Fourier coefficients given in equation (3). Advantageously, this eleminates the computationally costly calculation of the Fourier coefficients in the digital domain. Since the behavior of each resonator corresponds to the coefficients for each wavenumber that needs to be calculated, these values can be stored and eventually used for reconstruction of a signal.

With the amplitude, $\Psi_k$, and phase, $\phi_k$, for each wavenumber (resonator) known, the original signal can be calculated with:

$$\Psi_n = DC + \sum_{k=1}^{N_r} \psi_k \cos\left(\frac{2\pi n k}{N_p} + \phi_k\right) \qquad (25)$$

where $\Psi_n$ is the signal value at position n of $N_p$ total points, and DC is the average signal value over the entire set.

A total of $N_r$ wavenumbers are used in the reconstruction, which corresponds to the number of active resonators.

Equation (25) can be broken down into its individual components that correspond to all of the measured or known values. Combining equation (25) with their components from previous equations yields:

$$\Psi_n = \overbrace{DC}^{\text{Avg Value}} + \qquad (26)$$

$$\sum_{k=1}^{N_r} \frac{\overbrace{A_k(t) \cdot K_k}^{\text{Amplitude}}}{G \cdot T_k \cdot \left(1 - e^{\frac{-k\omega_0 t}{2Q_k}}\right)}$$

$$\cos\left(\overbrace{\frac{2\pi n k}{N_p}}^{\text{Position}} + \overbrace{\frac{1\text{bit(polarity)}}{(\Delta_1 - \Delta_2)} \cdot \cos^{-1}\left(\frac{\Delta_1}{A_k(t)}\right)}^{\text{Measured Phase}} + \right.$$

$$\left. \tan^{-1}\overbrace{\left(\frac{\frac{1}{Q_k}\frac{\omega_k}{\omega_{nat}}}{1 - \left(\frac{\omega_k}{\omega_{nat}}\right)^2}\right)}^{\text{Phase Lag}} + \overbrace{\theta_k}^{\substack{\text{Measurement} \\ \text{Other}}}\right)$$

Although this equation appears somewhat unwieldy, many of the terms are constant for a given device and may be calibrated. For example, an amplitude constant, $\beta_k$, can be derived from calibration. This amplitude constant is:

$$\underset{\substack{\text{Calibrated}\\\text{Amplitude}\\\text{Constant}}}{\beta_k} = \frac{K_k}{G \cdot T_k \cdot \left(1 - e^{\frac{-k\omega_0 t}{2Q_k}}\right)} \quad (27)$$

Similarly, the phase constant, $\delta_k$, may be calibrated. The phase constant is:

$$\underset{\substack{\text{Calibrated}\\\text{Phase}\\\text{Constant}}}{\delta_k} = \tan^{-1}\left(\frac{\frac{1}{Q_k}\frac{\omega_k}{\omega_{nat}}}{1 - \left(\frac{\omega_k}{\omega_{nat}}\right)^2}\right) + \theta_k \quad (28)$$

These constants can be directly calibrated for a device that generates an input signal by running known harmonics through the device to determine the multipliers and offsets. In a compressed file, the header of the file may contain these calibration constants, from which the original signal can be reconstructed.

With these calibration constants, the signal value at position n now becomes:

$$\Psi_n = DC + \sum_{k=1}^{N_p} \beta_k A_k \cos\left(\frac{2\pi nk}{N_p} + \Phi_k + \delta_k\right) \quad (29)$$

Error From Coupling to Alternate Wavenumbers

Although a device with a large Q effectively responds to only a very narrow band of frequencies, a resonator with a low Q or one that operates off resonance, can have a large relative response to alternate wavenumbers. Unlike a discrete computational process like the FFT, the MEMS resonators respond to other wavenumbers, albeit at a very attenuated level. This can be quantified to demonstrate the magnitude of the error mechanisms introduced from the mechanical calculation of the transform.

With a discrete number of input values, the maximum error introduced from alternate wavenumbers is the sum of the amplitudes of the other wavenumbers multiplied by their relative transmissibility. The actual error will depend on the input signal, and will vary depending upon the magnitude of the different wavenumbers and their phase. A maximum bound on this error can be given as:

$$\varepsilon(k_{ref}) = \sum_{k=1}^{k_{max}} \frac{\Psi_k \cdot T_{k \to k_{ref}}}{T_k} - \Psi_{k_{ref}} \quad (30)$$

The total combined possible error is equal to:

$$\varepsilon_{max} = \sum_{k=1}^{k_{max}} \varepsilon(k) = \sum_{kref=1}^{k_{max}} \sum_{k=1}^{k_{max}} \frac{\Psi_k \cdot T_{k \to k_{ref}}}{T_k} - \Psi_{k_{ref}} \quad (31)$$

These equations are all coupled, and can be solved simultaneously to determine the wavenumber amplitudes independent of the cross coupling. This system of equations may be represented mathematically as:

$$\begin{bmatrix} \chi_{1,1} & \chi_{2,1} & \cdots & \chi_{N_p,1} \\ \chi_{1,2} & \vdots & \vdots & \vdots \\ \vdots & \vdots & \vdots & \vdots \\ \chi_{1,N_p} & \cdots & \cdots & \chi_{N_p,N_p} \end{bmatrix} \begin{bmatrix} A_{k=1} \\ A_{k=2} \\ \vdots \\ A_{k=N_p} \end{bmatrix} = \begin{bmatrix} \Psi_{k=1} \\ \Psi_{k=2} \\ \vdots \\ \Psi_{k=N_p} \end{bmatrix} \quad (32)$$

This may be simplified as:

$$[\overline{\chi}] \cdot [\overline{A}] = [\Psi] \quad (33)$$

The coefficients $\chi$ may be determined during calibration of the device and are equivalent to the $\beta$ multiplier for the alternate modes. The amplitudes of the of each wavenumber can then be determined with:

$$\Psi_k = \chi_{1,k}A_1 + \chi_{2,k}A_2 + \cdots \chi_{N_p,k}A_{N_p} \quad (34)$$

Small terms, which are not stored, can be considered zero during reconstruction.

Compensation for the errors introduced due to the use of a mechanical system is computationally costly, and is usually unnecessary to reconstruct a signal of acceptable quality. However, it is an option if higher quality signal reconstruction is desired.

Image Processing and Compression

As described above, an embodiment of the invention effectively determines a Fourier transform for a signal. Since the Fourier transform is often used in image processing and can be used in image compression, the embodiments of the invention may be used for image processing and compression applications.

Prior to processing an image using the methods and apparatus of the invention, the image is desirably converted into a one-dimensional waveform that may be applied as in input signal. One method for doing this is illustrated in FIG. 9.

First, an image 902 is deconstructed into a number of smaller sub-blocks for processing. Each such sub-block contains a predetermined number of pixels. In the example shown in FIG. 9, a sub-block 904 is eight pixels wide by eight pixels high. Next, a scan 906 is performed on the two-dimensional pixel array to generate a one-dimensional waveform 908. In the example shown in FIG. 9, the scan 906 is performed by reading out the pixel values in the pattern shown in FIG. 9, starting with the upper left corner, and proceeding with a diagonal scan until the lower right corner of the sub-block 904 is reached.

The one-dimensional waveform 908 that results from the scan 906 can be used as an input signal to the array of MEMS resonators described above, permitting processing or compression according to the invention. An embodiment of the invention adapted for image compression could be used in a variety of low-power embeded systems, such as digital cameras.

Figure 9:
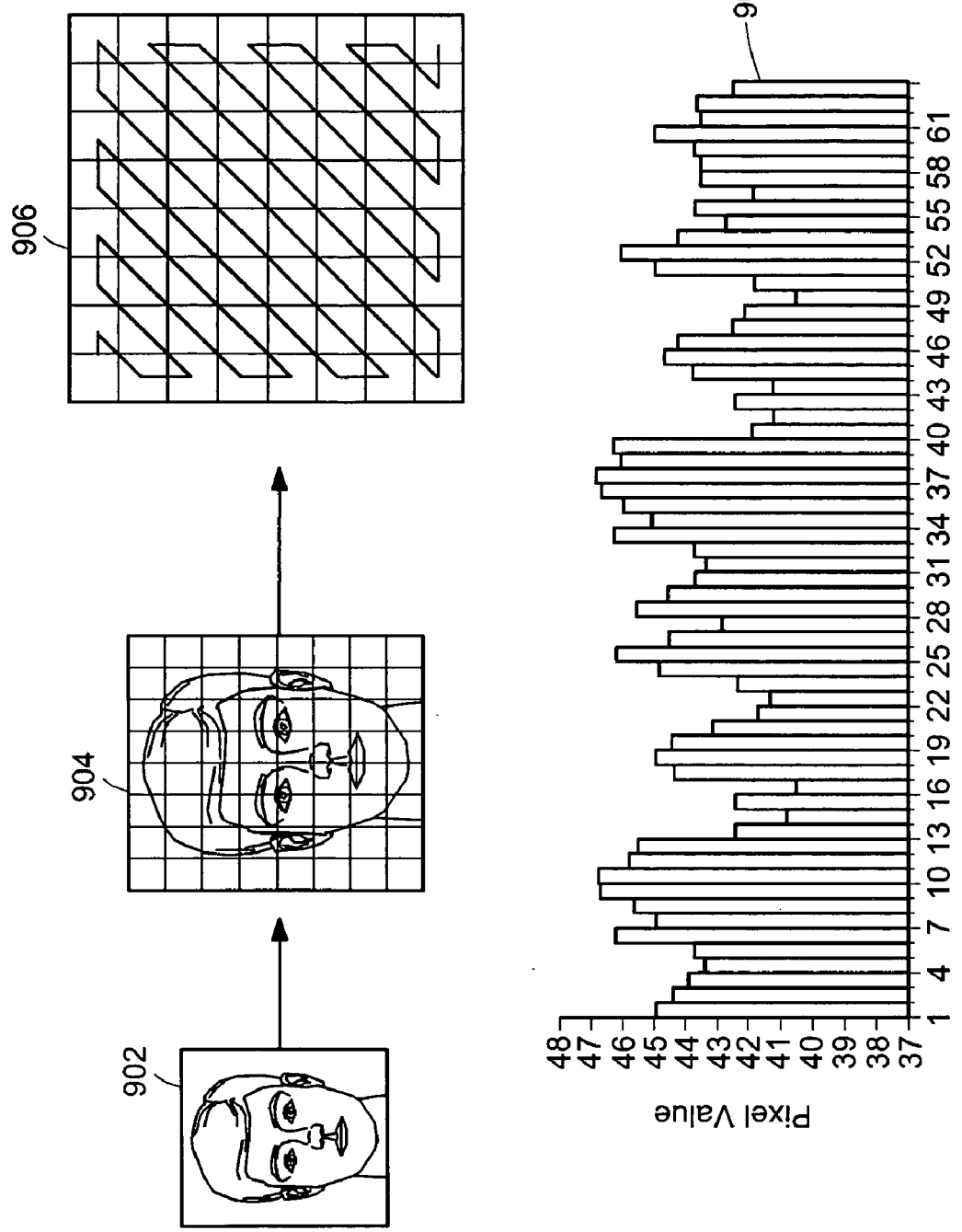
FIG. 9 is a block diagram illustrating creation of one-dimensional waveforms from images.

Although FIG. 9 shows the conversion of a greyscale image into a one-dimensional waveform, the same method may be used with color images by repeating the method shown in FIG. 9 for each color channel. Also, it will be understood that various sub-block sizes and pixel scanning methods can be used to convert a two-dimensional image into a one-dimensional waveform suitable for use as an input signal to an array of resonators.

Since an embodiment of the invention effectively determines a Fourier transform for a signal, there are many applications for the invention in addition to image processing and compression. For example, embodiments of the system and methods of the invention could be used for processing voice or other audio signals, processing signals from sensors, pattern recognition applications, or many other signal processing applications.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:

1. A method of processing an electrical input signal, the method comprising:
   providing the electrical input signal to a mechanically resonant structure;
   mechanically processing, by the mechanically resonant structure, the electrical input signal to derive Fourier coefficients thereof, each of the Fourier coefficients corresponding to a wavenumber and being determined from an amplitude and a phase of a response of the mechanically resonant structure to the electrical input signal; and
   discarding non-critical information in the Fourier coefficients.

2. The method of claim 1, wherein discarding non-critical information comprises discarding coefficients that correspond to wavenumbers having an amplitude less than a predetermined threshold.

3. The method of claim 1, wherein mechanically processing the electrical input signal comprises deriving a Fourier coefficient corresponding to a wavenumber of a harmonic of the electrical input signal.

4. The method of claim 1, wherein the mechanically resonant structure comprises an array of MEMS resonators, each having a natural frequency corresponding to one of the Fourier coefficients.

5. The method of claim 1, further comprising using information in the Fourier coefficients that was not discarded to determine an output signal.

6. The method of claim 5, further comprising converting the output signal into a digital output signal.

7. The method of claim 6, further comprising providing the digital output signal to a device that further processes the digital output signal.

8. The method of claim 6, wherein the digital output signal has a number of bits that depends on the wavenumber.

9. The method of claim 6, wherein the digital output signal has a number of bits that depends on a user-defined quality setting.

10. The method of claim 1, wherein mechanically processing the electrical input signal further comprises rescanning the electrical input signal at a frequency different than an original frequency of the electrical input signal.

11. Apparatus for processing an electrical input signal, the apparatus comprising:
    a mechanically resonant structure for receiving the electrical input signal and mechanically deriving Fourier coefficients therefrom, each of the Fourier coefficients corresponding to a wavenumber and being determined from an amplitude and a phase of a response of the mechanically resonant structure to the electrical input signal; and
    a device for discarding non-critical information in the Fourier coefficients.

12. The apparatus of claim 11, wherein the device discards Fourier coefficients that correspond to wavenumbers having an amplitude less than a predetermined threshold.

13. The apparatus of claim 11, wherein each wavenumber corresponds to a harmonic of the electrical input signal.

14. The apparatus of claim 11, wherein the mechanically resonant structure comprises a MEMS resonator.

15. The apparatus of claim 14, wherein the MEMS resonator has a natural frequency that corresponds to a harmonic of the electrical input signal.

16. The apparatus of claim 11, wherein the electrical input signal comprises an analog electrical input signal.

17. The apparatus of claim 11, wherein the device is further configured to generate an analog output signal.

18. The apparatus of claim 17, further comprising an analog-to-digital converter for converting the analog output signal into a digital output signal.

19. The apparatus of claim 18, wherein the digital output signal has a number of bits that depends on the wavenumber.

20. The apparatus of claim 18, wherein the digital output signal has a number of bits that depends on a user-defined quality setting.

21. A method of compressing an image comprising:
    deconstructing an image into one or more sub-blocks, each sub-block containing a predetermined number of pixels; and
    for each sub-block:
      scanning the pixels of the subblock to create a one-dimensional waveform;
      providing the one-dimensional waveform as an input signal to an electromechanical device that derives therefrom coefficients of a Fourier series for the one-dimensional waveform, each of the coefficients indicating an amplitude; and
      discarding non-critical information in the coefficients of the Fourier series.

22. The method of claim 21, wherein discarding non-critical information comprises discarding coefficients in the Fourier series for which the amplitude is below a predetermined threshold.

23. The method of claim 21, wherein providing the one-dimensional waveform as an input signal to an electromechanical device comprises applying the one-dimensional waveform to an array of MEMS resonators.

* * * * *